(12) United States Patent
Tsujiguchi

(10) Patent No.: US 11,154,807 B2
(45) Date of Patent: Oct. 26, 2021

(54) FAN SCRUBBER AND CONTROLLING METHOD OF FAN SCRUBBER

(71) Applicant: TOSHIBA MEMORY CORPORATION, Minato-ku (JP)

(72) Inventor: Yuki Tsujiguchi, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 272 days.

(21) Appl. No.: 16/238,567

(22) Filed: Jan. 3, 2019

(65) Prior Publication Data
US 2020/0061516 A1    Feb. 27, 2020

(30) Foreign Application Priority Data
Aug. 22, 2018   (JP) .............. JP2018-155639

(51) Int. Cl.
*B01D 47/06* (2006.01)
*C23C 16/44* (2006.01)

(52) U.S. Cl.
CPC .......... *B01D 47/06* (2013.01); *C23C 16/4412* (2013.01)

(58) Field of Classification Search
CPC .......... B01D 2247/104; B01D 2247/14; B01D 47/06; B01D 47/08; C23C 16/4412
See application file for complete search history.

(56) References Cited

U.S. PATENT DOCUMENTS

| | | |
|---|---|---|
| 6,638,343 B1 | 10/2003 | Kawamura et al. |
| 2003/0089241 A1 | 5/2003 | Okuda et al. |
| 2003/0164560 A1 | 9/2003 | Okuda et al. |
| 2006/0032378 A1 | 2/2006 | Okuda et al. |
| 2017/0007961 A1* | 1/2017 | Furuta ............... B01D 53/38 |

FOREIGN PATENT DOCUMENTS

| | | |
|---|---|---|
| JP | 6-172753 | 6/1994 |
| JP | 2003-144826 | 5/2003 |
| JP | 2003-251130 | 9/2003 |
| JP | 2005-131509 | 5/2005 |
| JP | 2007-090276 | 4/2007 |
| JP | 2007-203290 | 8/2007 |
| JP | 2017-013027 | 1/2017 |
| JP | 2017-018894 | 1/2017 |
| WO | WO 00/32299 A1 | 6/2000 |

OTHER PUBLICATIONS

Bing search semiconductor exhaust gas fan scrubber accessed Apr. 10, 2021.*

* cited by examiner

*Primary Examiner* — Cabrena Holecek
(74) *Attorney, Agent, or Firm* — Oblon, McClelland, Maier & Neustadt, L.L.P.

(57) ABSTRACT

According to one embodiment, a fan scrubber includes an inlet pipe to be connected to a post-stage side of a vacuum pump, in a state where a film preparation apparatus is arranged at a pre-stage before the vacuum pump, a process chamber connected to the inlet pipe, and containing a fan connected to a main shaft of a motor, a heater configured to heat the inlet pipe, and a controller configured to control turning on/off of the heater. The controller turns off the heater, when a signal received from the film preparation apparatus has been switched from a film preparation signal to a cleaning signal.

20 Claims, 4 Drawing Sheets

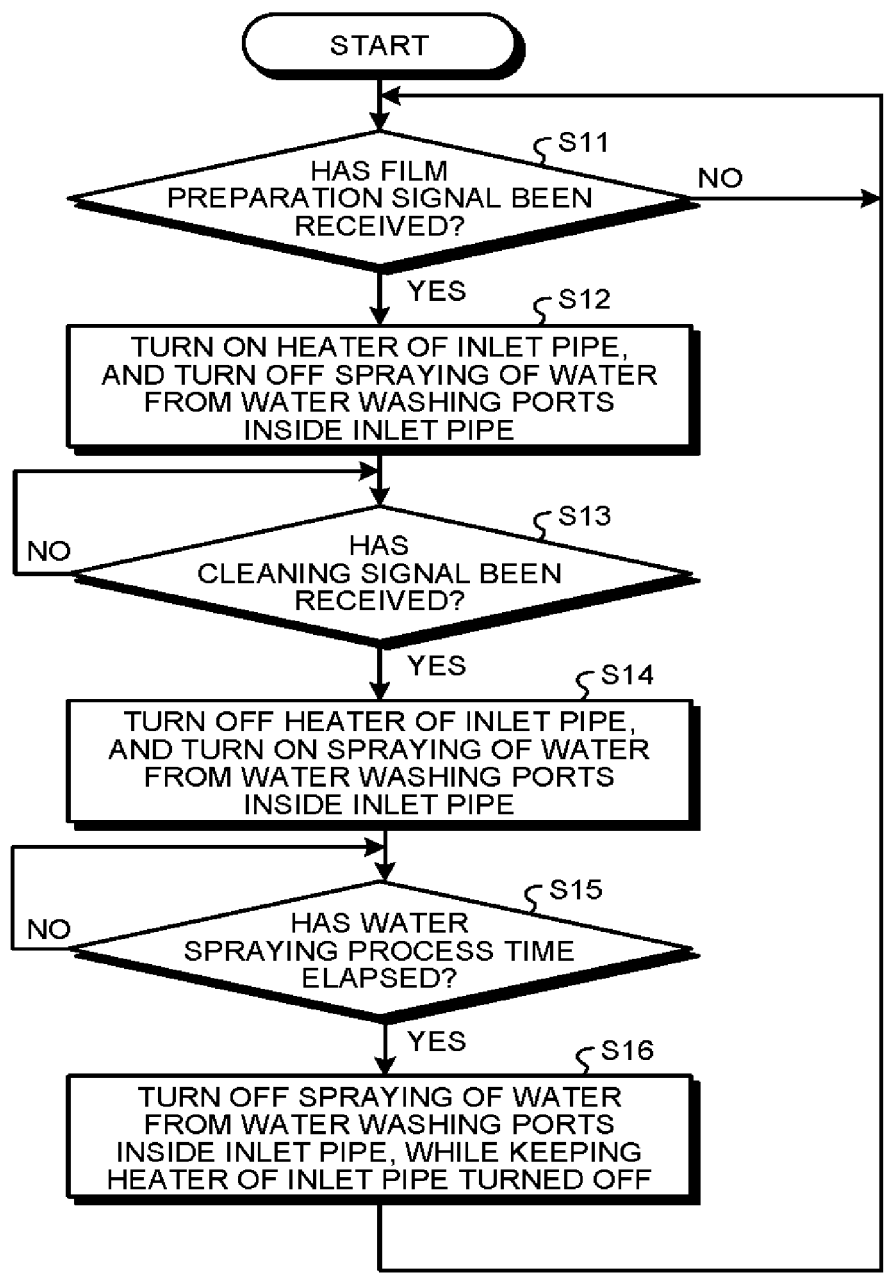

US 11,154,807 B2

FAN SCRUBBER AND CONTROLLING METHOD OF FAN SCRUBBER

CROSS-REFERENCE TO RELATED APPLICATIONS

This application is based upon and claims the benefit of priority from Japanese Patent Application No. 2018-155639, filed on Aug. 22, 2018; the entire contents of which are incorporated herein by reference.

FIELD

An embodiment described herein relates generally to a fan scrubber and a controlling method of a fan scrubber.

BACKGROUND

There is a case where a process gas exhausted from a vacuum pump connected to a film preparation apparatus contains foreign substances, such as reaction products. In consideration of this, conventionally, a fan scrubber is arranged at the post-stage after the vacuum pump, such that the foreign substances are removed by the fan scrubber, and then the process gas is abated by an abatement apparatus.

In the film preparation apparatus, a cleaning process is executed at predetermined timing. During the cleaning process, corrosion comes to be accelerated by the cleaning gas inside the inlet pipe connecting the fan scrubber to the vacuum pump.

BRIEF DESCRIPTION OF THE DRAWINGS

FIG. 3 is a flowchart illustrating an example of a processing sequence to be executed by the controller of the fan scrubber according to the embodiment;

DETAILED DESCRIPTION

In general, according to one embodiment, a fan scrubber includes an inlet pipe to be connected to a post-stage side of a vacuum pump, in a state where a film preparation apparatus is arranged at a pre-stage before the vacuum pump, a process chamber connected to the inlet pipe, and containing a fan connected to a main shaft of a motor, a heater configured to heat the inlet pipe, and a controller configured to control turning on/off of the heater. The controller turns off the heater, when a signal received from the film preparation apparatus has been switched from a film preparation signal to a cleaning signal.

An exemplary embodiment of a fan scrubber and a controlling method of a fan scrubber will be explained below in detail with reference to the accompanying drawings. The present invention is not limited to the following embodiment.

Figure 1:
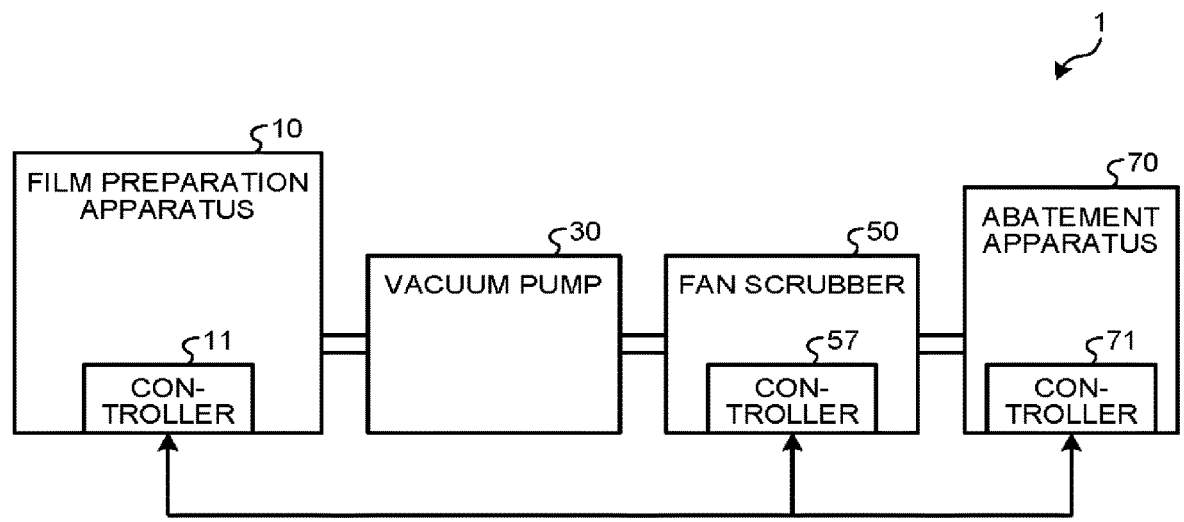
FIG. 1 is a diagram schematically illustrating a configuration example of a film preparation system including a fan scrubber according to an embodiment.

FIG. 1 is a diagram schematically illustrating a configuration example of a film preparation system including a fan scrubber according to an embodiment. The film preparation system 1 includes a film preparation apparatus 10, a vacuum pump 30, a fan scrubber 50, and an abatement apparatus 70. The film preparation apparatus 10 is an apparatus for preparing a thin film on a processing object. In the film preparation apparatus 10, the inside of a chamber is set to a predetermined vacuum level, and a process gas is caused to flow inside the chamber, to perform a film preparation process. Further, in the film preparation apparatus 10, every time the film preparation process has been performed a predetermined number of times, or at predetermined timing, a cleaning process is performed to peal and remove deposits sticking to the chamber inner wall or the like of the film preparation apparatus 10. During the cleaning process, a cleaning gas, such as HF or $F_2$, is caused to flow inside the chamber. The film preparation apparatus 10 is provided with a controller 11 for controlling an operation of the film preparation apparatus 10 in accordance with a recipe. During the film preparation process, the controller 11 transmits a film preparation signal, which indicates that the film preparation process is under execution, to the fan scrubber 50 and the abatement apparatus 70. Further, during the cleaning process, the controller 11 transmits a cleaning signal, which indicates that the cleaning process is under execution, to the fan scrubber 50 and the abatement apparatus 70. Here, it is assumed that the film preparation signal is output continuously while the film preparation apparatus 10 performs the film preparation process. Further, it is assumed that the cleaning signal is output continuously while the film preparation apparatus 10 performs the cleaning process.

The vacuum pump 30 is arranged at the post-stage after the film preparation apparatus 10, to exhaust gas from inside the chamber of the film preparation apparatus 10.

The fan scrubber 50 is arranged at the post-stage after the vacuum pump 30, to remove solid foreign substances, such as reaction products, contained in gas from the vacuum pump 30. The fan scrubber 50 is provided with a controller 57 for controlling an operation of the fan scrubber 50 in accordance with a recipe.

The abatement apparatus 70 is arranged at the post-stage after the fan scrubber 50, to abate gas that has passed through the fan scrubber 50. The abatement apparatus 70 abates gas that has passed through the fan scrubber 50, by combusting and decomposing the gas, for example. The abatement apparatus 70 is provided with a controller 71 for controlling an operation of the abatement apparatus 70 in accordance with a recipe.

Figure 2:
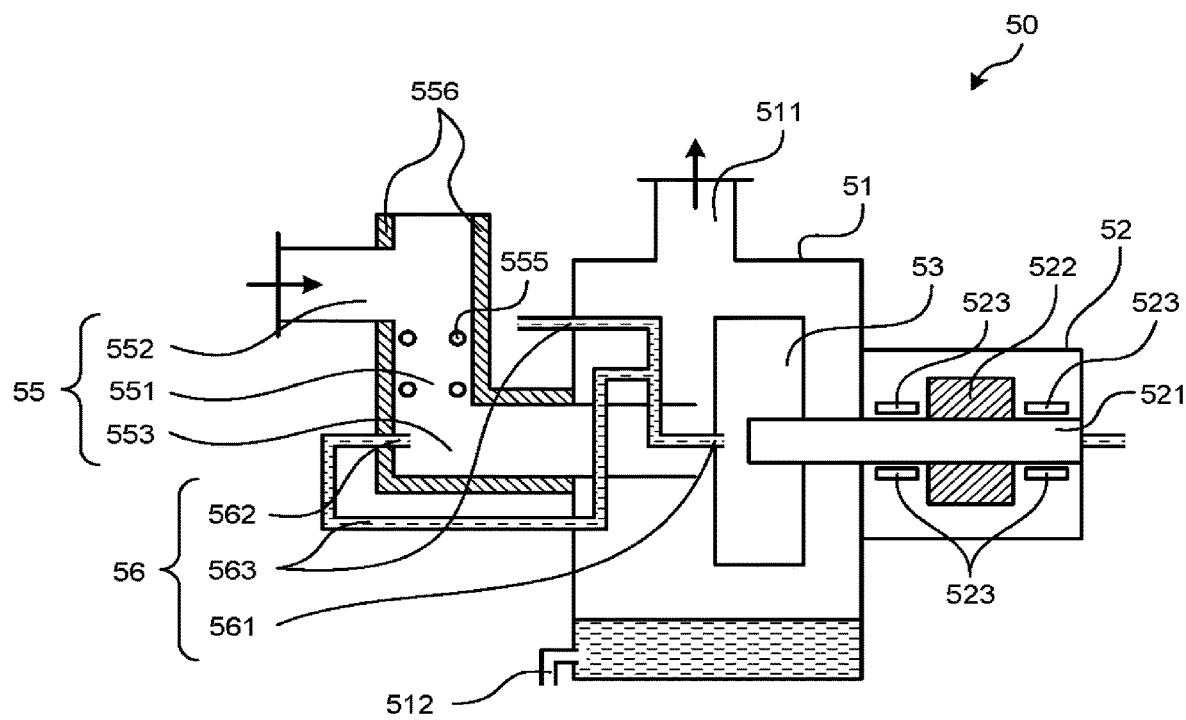
FIG. 2 is a sectional view schematically illustrating an apparatus configuration example of the fan scrubber according to the embodiment.

FIG. 2 is a sectional view schematically illustrating an apparatus configuration example of the fan scrubber according to the embodiment. The fan scrubber 50 includes a process chamber 51 and a motor 52. The process chamber 51 is provided with a fan 53 inside. The motor 52 includes a main shaft 521, a rotor 522 provided on the main shaft 521, and sliding bearings 523 provided at the front and rear sides of the rotor 522. The fan 53 is attached to the main shaft 521 of the motor 52, to be rotated by power from the motor 52.

The process chamber 51 includes a gas exhaust port 511 for exhausting gas that has been subjected to processing. The gas exhaust port 511 is connected to the abatement apparatus 70 through a pipe (not illustrated). Further, the process chamber 51 includes a liquid discharge port 512 for discharging a cleaning liquid that has been subjected to processing.

The process chamber 51 is provided with an inlet pipe 55 for introducing gas from the vacuum pump 30 to near the center of the fan 53. The inlet pipe 55 includes a vertical pipe portion 551, a first horizontal pipe portion 552, and a second horizontal pipe portion 553. The vertical pipe portion 551 guides gas in a substantially vertical direction. The first horizontal pipe portion 552 has one end connected to the gas exhaust port of the vacuum pump 30 and the other end connected to the vertical pipe portion 551, and guides gas in a substantially horizontal direction. The second horizontal pipe portion 553 has one end connected to the vertical pipe portion 551 and the other end arranged at a position facing near the center of the fan 53, and guides gas in a substantially horizontal direction. The second horizontal pipe portion 553 is arranged at a position lower than the first horizontal pipe portion 552. With this arrangement, gas flowing into the inlet pipe 55 passes through the first horizontal pipe portion 552, the vertical pipe portion 551, and the second horizontal pipe portion 553, and then flows out to near the center of the fan 53.

Water washing ports 555 are provided inside the vertical pipe portion 551, and arranged at a region below the connecting position of the vertical pipe portion 551 with the first horizontal pipe portion 552 and above the connecting position of the vertical pipe portion 551 with the second horizontal pipe portion 553. The water washing ports 555 are spray ports for causing water to flow toward the inner wall of the vertical pipe portion 551. In order to prevent sticking of reaction products due to a process gas, or to wash sticking reaction products, inside the vertical pipe portion 551, spraying of water is performed from the water washing ports 555. In this case, the spraying of water is performed in a predetermined period after reception of the film preparation signal is cut off, during the film preparation process. Further, in this embodiment, when the film preparation process is shifted to the cleaning process, spraying of water is performed from the water washing ports 555, to lower the temperature of the inlet pipe 55 down to near room temperature. In this case, the spraying of water is performed in a predetermined period, upon reception of the cleaning signal.

Outside the inlet pipe 55, a heater 556 for heating the inlet pipe 55 is provided. As the heater 556, for example, a gasket heater is used. The heater 556 is wrapped around the outer periphery of the inlet pipe 55, and heats the inlet pipe 55 to prevent reaction products due to a process gas from being deposited on and sticking to the inner wall of the inlet pipe 55.

The fan scrubber 50 is provided with a liquid delivery part 56. The liquid delivery part 56 includes a nozzle 561 arranged at a position facing near the center of the fan 53 of the process chamber 51, a nozzle 562 provided on the lower sidewall of the vertical pipe portion 551 of the inlet pipe 55, and a pipe 563 connected to the nozzles 561 and 562. The liquid delivery part 56 supplies a cleaning liquid to the nozzles 561 and 562, and delivers the cleaning liquid from the nozzles 561 and 562, by a pressure feed mechanism (not illustrated), for example. When the cleaning liquid is delivered from the nozzle 561 arranged to face near the center of the fan 53, the cleaning liquid comes into contact with gas inside the process chamber 51, and catches foreign substances contained in the gas. When the cleaning liquid is delivered from the nozzle 562 provided on the lower sidewall of the vertical pipe portion 551, the cleaning liquid washes reaction products sticking to the inner wall of the inlet pipe 55, and/or catches reaction products sticking to the inner wall of the inlet pipe 55. The cleaning liquid containing foreign substances thus caught is collected in the lower side of the process chamber 51, and is then discharged from the liquid discharge port 512. As the cleaning liquid, for example, pure water is used.

The controller 57 controls operations of respective parts of the fan scrubber 50 on the basis of a signal from the controller 11 of the film preparation apparatus 10, to perform operations for film preparation steps when the film preparation apparatus 10 is set in the film preparation steps, and to perform operations for cleaning steps when the film preparation apparatus 10 is set in the cleaning steps. Upon reception of the film preparation signal, the controller 57 turns on the heater 556 arranged on the inlet pipe 55, and turns off spraying of water from the water washing ports 555 inside the inlet pipe 55. Further, the controller 57 turns on supply of a cleaning liquid from the nozzles 561 and 562, and causes the motor 52 to drive. Then, the controller 57 keeps the state thus made, during continuous reception of the film preparation signal from the controller 11 of the film preparation apparatus 10.

Further, upon reception of the cleaning signal next from a state with reception of the film preparation signal, the controller 57 turns off the heater 556 arranged on the inlet pipe 55, and turns on spraying of water from the water washing ports 555 inside the inlet pipe 55. Further, the controller 57 turns on supply of a cleaning liquid from the nozzles 561 and 562, and keeps the motor 52 in the driving state.

Thereafter, the controller 57 determines whether a predetermined time has elapsed since reception of the cleaning signal. When the predetermined time has elapsed, the controller 57 turns off spraying of water from the water washing ports 555 inside the inlet pipe 55. Then, the controller 57 keeps the state thus made, during continuous reception of the cleaning signal from the film preparation apparatus 10. As described above, according to this embodiment, upon reception of the cleaning signal sent from the film preparation apparatus 10, the heater 556 of the inlet pipe 55 is turned off, and the temperature of the inlet pipe 55 is thereby lowered to a temperature close to room temperature, during the cleaning period. Thus, during the cleaning period, corrosion inside the inlet pipe 55 is suppressed.

Figure 4A:
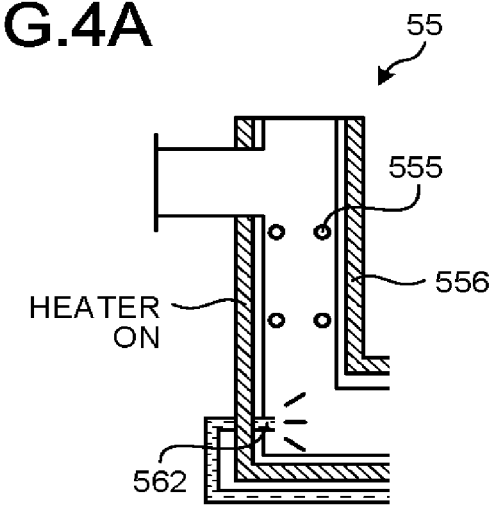
FIGS. 4A to 4C are diagrams schematically illustrating states of the inlet pipe of the fan scrubber according to the embodiment.
Figure 4B:
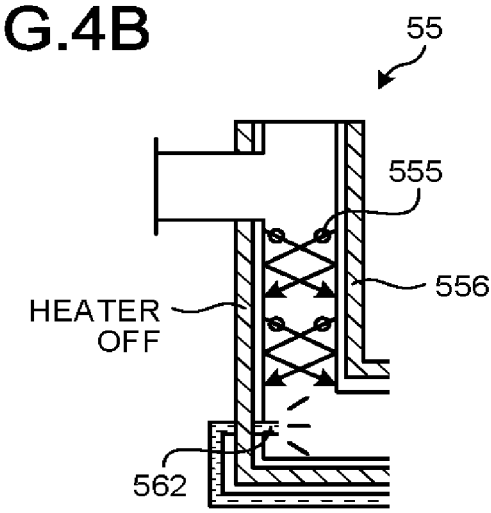
Figure 4C:
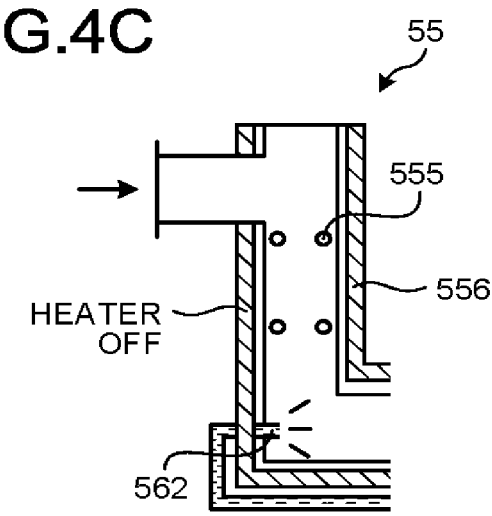

Next, an explanation will be given of processing in the fan scrubber 50. FIG. 3 is a flowchart illustrating an example of a processing sequence to be executed by the controller of the fan scrubber according to the embodiment. FIGS. 4A to 4C are diagrams schematically illustrating states of the inlet pipe of the fan scrubber according to the embodiment. Here, on the premise that a cleaning liquid is always supplied from the nozzles 561 and 562, and the motor 52 is always driven, an explanation will be given only of control for the water washing ports 555 and the heater 556 of the inlet pipe 55.

First, the controller 57 of the fan scrubber 50 determines whether a film preparation signal has been received from the controller 11 of the film preparation apparatus 10 (step S11). When the film preparation signal has not been received from the film preparation apparatus 10 (No at step S11), a waiting state follows. When the film preparation signal has been received from the film preparation apparatus 10 (Yes at step S11), as illustrated in FIG. 4A, the controller 57 turns on the heater 556 of the inlet pipe 55, and turns off spraying of water from the water washing ports 555 inside the inlet pipe 55 (step S12). Then, a film preparation process is executed by the film preparation apparatus 10, during which the fan scrubber 50 performs processing of the process gas.

Then, the controller 57 determines whether a cleaning signal has been received from the film preparation apparatus 10 (step S13). When the cleaning signal has not been received (No at step S13), a waiting state follows, until reception of the cleaning signal. Accordingly, the processing of the process gas exhausted from the film preparation apparatus 10 is continuously performed.

When the cleaning signal has been received (Yes at step S13), as illustrated in FIG. 4B, the controller 57 turns off the heater 556 of the inlet pipe 55, and turns on spraying of water from the water washing ports 555 inside the inlet pipe 55 (step S14). Accordingly, the film preparation apparatus 10 shifts to a cleaning process.

Thereafter, the controller 57 determines whether a predetermined water spraying process time has elapsed since reception of the cleaning signal (step S15). The water spraying process time may be set to a time for which the spraying of water is kept performed at a predetermined temperature and with a predetermined flow rate until the temperature of the inlet pipe 55 during the film preparation process is lowered to a predetermined temperature, for example. The predetermined temperature may be set to room temperature, or a temperature at which corrosion inside the inlet pipe 55 substantially does not make progress by the cleaning gas, for example.

When the water spraying process time has not elapsed since reception of the cleaning signal (No at step S15), a waiting state follows, until the water spraying process time has elapsed. Here, the time counting starts from the time point of reception of the cleaning signal. However, the time counting may start from the time point of turning off the heater 556 of the inlet pipe 55, or the time point of turning on the spraying of water from the water washing ports 555.

When the water spraying process time has elapsed since reception of the cleaning signal (Yes at step S15), as illustrated in FIG. 4C, the controller 57 turns off spraying of water from the water washing ports 555 inside the inlet pipe 55, while keeping the heater 556 of the inlet pipe 55 turned off (step S16). Thereafter, the cleaning gas flows into the inlet pipe 55 from the vacuum pump 30. At this time, as the temperature of the inlet pipe 55 has been lowered to near room temperature, the degree of corrosion on the inner wall of the inlet pipe 55 by the cleaning gas becomes far smaller than that of a case where the inlet pipe 55 is heated by the heater 556. Thereafter, the processing sequence returns to step S11.

Here, in the example described above, the spraying of water from the water washing ports 555 inside the inlet pipe 55 is kept turned on for the predetermined water spraying process time since reception of the cleaning signal. However, it may be adopted to turn off the heater 556 of the inlet pipe 55 without turning on the spraying of water from the water washing ports 555, after reception of the cleaning signal, and then to wait until the temperature of the inlet pipe 55 becomes a predetermined temperature, before the cleaning gas is allowed to flow into the fan scrubber 50.

Figure 5:
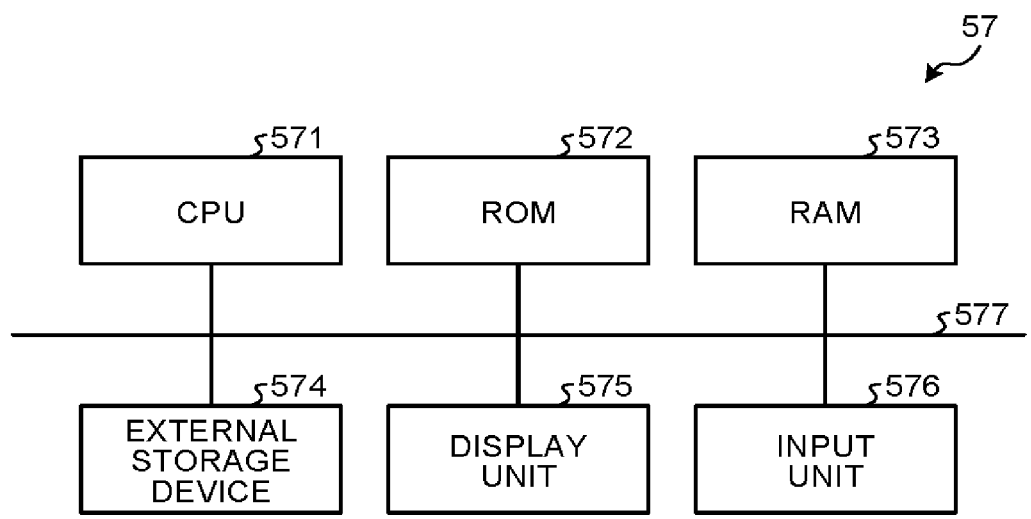
FIG. 5 is diagram illustrating a hardware configuration example of the controller of the fan scrubber.

FIG. 5 is diagram illustrating a hardware configuration example of the controller of the fan scrubber. The controller 57 of the fan scrubber 50 has a hardware configuration utilizing an ordinary computer, in which a Central Processing Unit (CPU) 571, a Read Only Memory (ROM) 572, a Random Access Memory (RAM) 573 serving as the main storage device, an external storage device 574, such as a Hard Disk Drive (HDD), Solid State Drive (SSD), or Compact Disc (CD) drive device, a display unit 575, such as a display device, and an input unit 576, such as a keyboard and/or a mouse, are included, and are connected to each other via a bus line 577.

A program to be executed by the controller 57 according to this embodiment has been prepared to perform the method illustrated in FIG. 3. This program is provided in a state recorded in a computer-readable recording medium, such as a CD-ROM, flexible disk (FD), CD-R(Recordable), or Digital Versatile Disk (DVD), by a file in an installable format or executable format.

Alternatively, a program to be executed by the controller 57 of the fan scrubber 50 according to this embodiment may be provided such that the program is stored in a computer connected to a network, such as the internet, and is downloaded via the network. Further, a program to be executed by the controller 57 of the fan scrubber 50 according to this embodiment may be provided such that the program is provided or distributed via a network, such as the Internet.

Alternatively, a program according to this embodiment may be provided in a state incorporated in an ROM or the like in advance.

According to the embodiment, when the signal received from the controller 11 of the film preparation apparatus 10 has been switched from the film preparation signal to the cleaning signal, the heater 556 of the inlet pipe 55 is turned off, and then the cleaning gas from the film preparation apparatus 10 is processed. As a result, the temperature of the inlet pipe 55 becomes lower than the temperature during the film preparation process. Thus, during the cleaning process, the degree of corrosion on the inner wall of the inlet pipe 55 by the cleaning gas becomes smaller, as compared with a case where the heater 556 of the inlet pipe 55 is kept turned on. Consequently, the service life of the inlet pipe 55 can be prolonged.

Further, when the signal received from the film preparation apparatus 10 has been switched from the film preparation signal to the cleaning signal, the heater 556 of the inlet pipe 55 is turned off, the spraying of water from the water washing ports 555 is performed for a predetermined time, and then the cleaning gas from the film preparation apparatus 10 is processed. As a result, the temperature of the inlet pipe 55 can be cooled rapidly from the temperature during the film preparation process to near room temperature. This makes it possible to shorten the time for the cleaning process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A fan scrubber comprising:
    an inlet pipe to be connected to a post-stage side of a vacuum pump connected to a film preparation apparatus, the film preparation apparatus being arranged at a pre-stage side of the vacuum pump;
    a process chamber connected to the inlet pipe, and containing a fan connected to a main shaft of a motor;
    a heater configured to heat the inlet pipe; and
    a controller configured to receive a signal from a controller of the film preparation apparatus and control operation of the heater based on the signal,
    wherein the controller of the fan scrubber turns off the heater when the signal received from the controller of the film preparation apparatus has been switched from a film preparation signal to a cleaning signal.

2. The fan scrubber according to claim 1, wherein the controller of the fan scrubber turns on the heater when the signal received from the film preparation apparatus has been switched from the cleaning signal to the film preparation signal.

3. The fan scrubber according to claim 1, wherein the inlet pipe is connected to the process chamber to face near a center of the fan in the process chamber.

4. The fan scrubber according to claim 1, wherein the heater is wrapped around an outer periphery of the inlet pipe.

5. The fan scrubber according to claim 1, further comprising a liquid delivery part that includes a first nozzle arranged to face near a center of the fan, and is configured to deliver a cleaning liquid toward the fan from the first nozzle.

6. The fan scrubber according to claim 5, wherein the liquid delivery part further includes a second nozzle configured to deliver the cleaning liquid inside the inlet pipe.

7. The fan scrubber according to claim 1, further comprising a water washing port configured to perform spraying of water inside the inlet pipe,
wherein the controller of the fan scrubber turns off the heater and turns on spraying of water from the water washing port when the signal received from the film preparation apparatus has been switched from the film preparation signal to the cleaning signal.

8. The fan scrubber according to claim 7, wherein the controller of the fan scrubber turns off spraying of water from the water washing port after a predetermined time has elapsed since reception of the cleaning signal.

9. The fan scrubber according to claim 7, wherein the controller of the fan scrubber turns off spraying of water from the water washing port after a predetermined time has elapsed since turning off the heater.

10. The fan scrubber according to claim 7, wherein the controller of the fan scrubber turns off spraying of water from the water washing port after a predetermined time has elapsed since turning on spraying of water from the water washing port.

11. The fan scrubber according to claim 10, wherein the predetermined time is a time to lower a temperature of the inlet pipe to a predetermined temperature.

12. The fan scrubber according to claim 7, wherein the inlet pipe includes
a vertical pipe portion configured to guide gas in a vertical direction,
a first horizontal pipe portion that includes one end connected to a gas exhaust port of the vacuum pump and another end connected to the vertical pipe portion, and is configured to guide gas in a horizontal direction, and
a second horizontal pipe portion that includes one end connected to the vertical pipe portion and another end arranged in the process chamber, and is configured to guide gas in a horizontal direction, and
wherein the water washing port is provided in the vertical pipe portion.

13. The fan scrubber according to claim 12, wherein the water washing port is provided in the vertical pipe portion, and positioned at a region below a connecting position with the first horizontal pipe portion and above a connecting position with the second horizontal pipe portion.

14. A controlling method of the fan scrubber according to claim 1 that is configured to process gas exhausted from the film preparation apparatus through the vacuum pump, by using the fan contained in the process chamber, the method comprising:
receiving a signal from the film preparation apparatus; and
turning off the heater when the signal received from the film preparation apparatus has been switched from a film preparation signal to a cleaning signal.

15. The controlling method according to claim 14, further comprising turning on the heater when the signal received from the film preparation apparatus has been switched from the cleaning signal to the film preparation signal, after the turning off the heater.

16. The controlling method according to claim 14, wherein the method comprises supplying a cleaning liquid toward the fan under rotation over a period before and after turning off the heater.

17. The controlling method according to claim 14, wherein the fan scrubber further includes a water washing port configured to perform spraying of water inside the inlet pipe, and
the turning off the heater includes turning off the heater and turning on spraying of water from the water washing port.

18. The controlling method according to claim 17, wherein the turning off the heater further includes
determining whether a predetermined time has elapsed since turning on spraying of water from the water washing port, and
turning off spraying of water from the water washing port when the predetermined time has elapsed since turning on spraying of water from the water washing port.

19. The controlling method according to claim 17, wherein the turning off the heater further includes
determining whether a predetermined time has elapsed since reception of the cleaning signal, and
turning off spraying of water from the water washing port when the predetermined time has elapsed since reception of the cleaning signal.

20. The controlling method according to claim 17, wherein the turning off the heater further includes
determining whether a predetermined time has elapsed since turning off the heater for the inlet pipe, and
turning off spraying of water from the water washing port when the predetermined time has elapsed since turning off the heater for the inlet pipe.

* * * * *